(12) United States Patent
Hwang et al.

(10) Patent No.: US 8,835,328 B2
(45) Date of Patent: Sep. 16, 2014

(54) METHODS FOR FABRICATING INTEGRATED CIRCUITS WITH IMPROVED SEMICONDUCTOR FIN STRUCTURES

(71) Applicant: Globalfoundries, Inc., Grand Cayman (KY)

(72) Inventors: Wontae Hwang, Clifton Park, NY (US); Il Goo Kim, Clifton Park, NY (US); Dae-Han Choi, Loudonville, NY (US); Sang Cheol Han, Clifton Park, NY (US)

(73) Assignee: Globalfoundries, Inc., Grand Cayman (KY)

( * ) Notice: Subject to any disclaimer, the term of this patent is extended or adjusted under 35 U.S.C. 154(b) by 3 days.

(21) Appl. No.: 13/763,399

(22) Filed: Feb. 8, 2013

(65) Prior Publication Data

US 2014/0227879 A1    Aug. 14, 2014

(51) Int. Cl.
*H01L 21/302* (2006.01)
*H01L 21/461* (2006.01)
*H01L 21/308* (2006.01)

(52) U.S. Cl.
CPC ........... *H01L 21/308* (2013.01); *Y10S 438/946* (2013.01); *Y10S 438/947* (2013.01)
USPC ........... 438/736; 438/694; 438/696; 438/700; 438/702; 438/703; 438/717; 438/725; 438/737; 438/946; 438/947

(58) Field of Classification Search
USPC ......... 438/694, 696, 700, 702, 703, 717, 725, 438/736, 737, 946, 947
See application file for complete search history.

(56) References Cited

U.S. PATENT DOCUMENTS

| | | | |
|---|---|---|---|
| 6,063,688 A * | 5/2000 | Doyle et al. | 438/424 |
| 7,390,749 B2 * | 6/2008 | Kim et al. | 438/702 |
| 2003/0006410 A1 * | 1/2003 | Doyle | 257/20 |
| 2007/0099431 A1 * | 5/2007 | Li | 438/735 |
| 2008/0008969 A1 * | 1/2008 | Zhou et al. | 430/313 |
| 2008/0057692 A1 * | 3/2008 | Wells et al. | 438/597 |
| 2008/0261349 A1 * | 10/2008 | Abatchev et al. | 438/106 |
| 2008/0305636 A1 * | 12/2008 | Kim et al. | 438/696 |
| 2009/0026584 A1 * | 1/2009 | Chang et al. | 257/618 |
| 2011/0053361 A1 * | 3/2011 | Muralidhar et al. | 438/585 |
| 2011/0129991 A1 * | 6/2011 | Armstrong et al. | 438/585 |
| 2013/0115777 A1 * | 5/2013 | Tung et al. | 438/703 |

\* cited by examiner

*Primary Examiner* — Bac Au
(74) *Attorney, Agent, or Firm* — Ingrassia Fisher & Lorenz, P.C.

(57) ABSTRACT

Methods for fabricating integrated circuits are provided herein. In an embodiment, a method for fabricating an integrated circuit includes providing a mandrel layer overlying a semiconductor substrate and patterning the mandrel layer into mandrel structures. The method further includes forming a protective layer between the mandrel structures. Spacers are formed around each of the mandrel structures and overlying the protective layer to define exposed regions of the protective layer and covered regions of the protective layer. The exposed regions of the protective layer are etched using the spacers and the mandrel structures as a mask. The spacers are removed from the covered regions of the protective layer. The covered regions of the protective layer form mask segments for etching the semiconductor substrate. The method removes the mandrel structures and etches the semiconductor substrate exposed between mask segments to form semiconductor fin structures.

20 Claims, 3 Drawing Sheets

METHODS FOR FABRICATING INTEGRATED CIRCUITS WITH IMPROVED SEMICONDUCTOR FIN STRUCTURES

TECHNICAL FIELD

The technical field generally relates to methods for fabricating integrated circuits, and more particularly relates to methods for fabricating integrated circuits with improved semiconductor fin structures.

BACKGROUND

In contrast to conventional planar metal-oxide-semiconductor field-effect transistors ("MOSFETs"), multi-gate transistors incorporate two or more gates into a single device. Relative to single gate transistors, multi-gate transistors reduce off-state current leakage, increase on-state current flow, and reduce overall power consumption. Multi-gate devices having non-planar topographies also tend to be more compact than conventional planar transistors and consequently permit higher device densities to be achieved.

One known type of non-planar, multi-gate transistor, commonly referred to as a "FinFET," includes two or more parallel fins ("fin structures") formed on a substrate, such as a silicon-on-insulator substrate. The fin structures extend along a first axis between common source and drain electrodes. At least one conductive gate structure is formed over the fin structures and extends along a second axis generally perpendicular to the first axis. More specifically, the gate extends across and over the fin structures such that an intermediate region of the gate conformally overlays three surfaces of each fin (i.e., an upper surface, a first sidewall surface, and a second opposing sidewall surface of each fin). The surfaces form the channel of the gate.

While providing the advantages noted above, FinFETs and other non-planar multi-gate devices (e.g., triFETs) can be somewhat difficult to fabricate due to their unique topographies, particularly at advanced technology nodes. For example, it is difficult to form fin structures having substantially uniform thicknesses and heights and which are separated by uniform recess widths. Conventional fin fabrication processes typically form recesses in a semiconductor material to define adjacent fin structures. Because conventional processes form recesses with varying depths and widths, the fin structures are formed with non-uniform thicknesses and heights.

Accordingly, it is desirable to provide methods for fabricating integrated circuits with improved semiconductor fin structures. Also, it is desirable to provide methods for fabricating integrated circuits with semiconductor fin structures wherein the methods incorporate use of uniform mask segments having planar upper surfaces and that are separated by uniform distances. It is also desirable to provide methods for fabricating semiconductor fin structures for integrated circuits. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided herein. In one exemplary embodiment, a method for fabricating an integrated circuit includes providing a mandrel layer overlying a semiconductor substrate and patterning the mandrel layer into mandrel structures. The method further includes forming a protective layer between the mandrel structures. Spacers are formed around each of the mandrel structures and overlying the protective layer to define exposed regions of the protective layer and covered regions of the protective layer. The exposed regions of the protective layer are etched using the spacers and the mandrel structures as a mask. The spacers are removed from the covered regions of the protective layer. The covered regions of the protective layer form mask segments for etching the semiconductor substrate. The method removes the mandrel structures and etches the semiconductor substrate exposed between mask segments to form semiconductor fin structures.

In another embodiment, a method for fabricating semiconductor fin structures for integrated circuits is provided. The method for fabricating semiconductor fin structures for integrated circuits includes forming structures from a mandrel layer overlying a surface of a semiconductor substrate. Mask segments are formed around the mandrel structures. Each mask segment has a planar upper surface substantially parallel to the surface of the semiconductor substrate. The mandrel structures are removed and the semiconductor substrate between mask segments is etched to form the semiconductor fin structures.

In another embodiment, a method for fabricating integrated circuits includes forming mandrel structures overlying a surface of a semiconductor substrate. The method coats the semiconductor substrate with an organic planarizing layer (OPL) and cures the OPL to form a protective layer between the mandrel structures. Spacers are formed around each of the mandrel structures and overlying portions of the protective layer to define exposed regions of the protective layer and covered regions of the protective layer. The exposed regions of the protective layer are etched using the spacers and the mandrel structures as a mask. The mandrel structures and the spacers are removed, and the covered regions of the protective layer form mask segments. The method includes etching the semiconductor substrate exposed between mask segments to form semiconductor fin structures.

BRIEF DESCRIPTION OF THE DRAWINGS

Embodiments of methods for fabricating integrated circuits and methods for fabricating semiconductor fin structures for integrated circuits will hereinafter be described in conjunction with the following drawing figures, wherein like numerals denote like elements, and wherein.

DETAILED DESCRIPTION

The following detailed description is merely exemplary in nature and is not intended to limit methods for fabricating integrated circuits or methods for fabricating semiconductor fin structures for integrated circuits as claimed herein. Furthermore, there is no intention to be bound by any expressed or implied theory presented in the preceding technical field, background or brief summary, or in the following detailed description.

In accordance with the various embodiments herein, methods for fabricating integrated circuits with improved semiconductor fin structures are provided. Issues faced by conventional processes for forming semiconductor fin structures in integrated circuits relating to fin structures having variable thicknesses and/or heights may be avoided. For example, it is contemplated herein that mask segments having planar upper surfaces be formed overlying semiconductor material. During an etch process for forming semiconductor fin structures from the semiconductor material, the mask segments facilitate etching of recesses between fin structures having uniform thicknesses and depths. As a result, semiconductor fin structures of substantially uniform heights and thicknesses are formed and are separated by a uniform distance.

FIGS. 1-9 illustrate steps in accordance with various embodiments of methods for fabricating integrated circuits. Various steps in the design and composition of integrated circuits are well known and so, in the interest of brevity, many conventional steps will only be mentioned briefly herein or will be omitted entirely without providing the well-known process details. Further, it is noted that integrated circuits include a varying number of components and that single components shown in the illustrations may be representative of multiple components.

Figure 1:
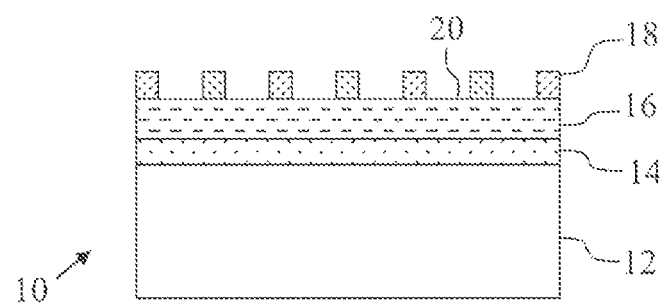
FIGS. 1-9 illustrate, in cross section, a portion of an integrated circuit and method steps for fabricating an integrated circuit in accordance with various embodiments herein.
Figure 2:
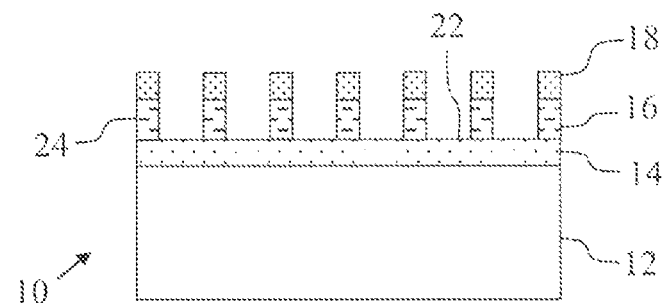

In FIG. 1, in an exemplary embodiment, the method for fabricating an integrated circuit 10 begins by providing a semiconductor substrate 12. The semiconductor substrate 12 is preferably a silicon substrate (the term "silicon substrate" encompassing the relatively pure silicon materials typically used in the semiconductor industry as well as silicon admixed with other elements, such as germanium and the like). Semiconductor substrate 12 can be a bulk silicon wafer. However, semiconductor substrate 12 preferably assumes the form of a silicon-on-insulator wafer including a thin layer of silicon overlying an intermediate insulating layer that is, in turn, supported by a silicon carrier wafer.

As shown in FIG. 1, in an exemplary embodiment, a capping layer 14 is formed overlying the semiconductor substrate 12. As used herein, the term "overlying" encompasses "on" and "over" and is used to describe the orientation and/or location of a feature or element within the consistent but arbitrary frame of reference illustrated by the drawings. In one embodiment, the capping layer is formed directly on the semiconductor substrate 12. In another embodiment, the capping layer is formed over the semiconductor substrate such that an intermediate layer is formed between the capping layer and the semiconductor substrate. An exemplary capping layer 14 is silicon nitride deposited over the semiconductor substrate utilizing a low temperature deposition process, such as plasma-enhanced chemical vapor deposition (PECVD) performed utilizing silane, ammonia, and/or nitrogen in the presence of an argon plasma. An exemplary intermediate layer is an additional capping layer interposed between capping layer 14 and the semiconductor substrate 12.

A mandrel layer 16 is also formed overlying the semiconductor substrate 12. In FIG. 1, the mandrel layer 16 is deposited onto the capping layer 14 utilizing a known deposition technique, such as chemical vapor deposition. A non-exhaustive list of materials that can be deposited to form mandrel layer 16 includes polycrystalline silicon, silicon oxynitride, silicon oxide, and silicon nitride. While a single capping layer 14 is formed between the mandrel layer 16 and the semiconductor substrate 12, it is contemplated that no capping layer 14 be used, or that more than one capping layer 14 be formed between mandrel layer 16 and semiconductor substrate 12.

In FIG. 1, a patterning layer, such as photoresist, is deposited and patterned using a photolithography process to form a mask 18 over the mandrel layer 16 according to well-known process steps. The mask 18 defines exposed regions 20 of the mandrel layer 16. The mandrel layer 16 is then etched using the mask 18 in FIG. 2. As shown, the etch process removes the exposed regions 20 of the mandrel layer 16 to expose a surface 22 of the underlying capping layer 14 (it is noted that in embodiments that lack a capping layer 14, the etch will expose a surface 22 of the semiconductor substrate 12). The etch results in the formation of sacrificial mandrel structures 24 from the mandrel layer 16 lying under the mask 18. In an exemplary embodiment, the sacrificial mandrel structures 24 have uniform widths and are uniformly spaced from one another. Further, the sacrificial mandrel structures 24 may be spaced from one another by a selected factor of their width, for example, they may be spaced from one another by a distance equal to three times their width.

Figure 3:
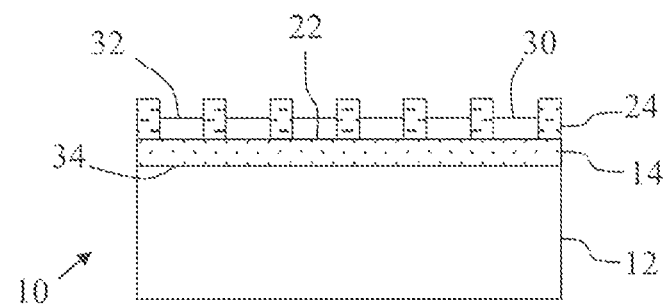

In FIG. 3, mask 18 is removed and a protective layer 30 is formed over the exposed surface 22, in accordance with an embodiment. As shown, the protective layer 30 is formed with an upper surface 32 that is substantially parallel to the top surface 34 of the semiconductor substrate 12. As used herein, the terms "upper" and "top" are used to describe the orientation and/or location of a feature or element within the consistent but arbitrary frame of reference illustrated by the drawings. In certain embodiments, the protective layer 30 may be deposited over the surface 22 and the sacrificial mandrel structures 24 and then removed from the sacrificial mandrel structures 24 as described below to result in the partially-completed integrated circuit 10 shown in FIG. 3. In other embodiments, the protective layer 30 is formed on the surface 22 between adjacent sacrificial mandrel structures 24 as shown in FIG. 3 without any removal process.

In an exemplary embodiment, the protective layer 30 is a flowable material deposited over the exposed surface 22 by spin coating. For example, the protective layer 30 may be an organic planarizing layer (OPL) suitably deposited onto the substrate by spin-coating and then cured by heating to the appropriate temperature. In one embodiment, protective layer 30 is a polyimide layer, for example, that may be cured by heating to a temperature of about 350° C. to about 400° C., in an inert atmosphere, for from about 20 to about 60 minutes.

The OPL can include a photo-sensitive organic polymer including a light-sensitive material that, when exposed to electromagnetic radiation, is chemically altered and configured to be removed using a developing solvent. For example, the photo-sensitive organic polymer may be polyacrylate resin, epoxy resin, phenol resin, polyamide resin, polyimide resin, unsaturated polyester resin, polyphenylenether resin, polyphenylenesulfide resin, or benzocyclobutene (BCB). More generally, the OPL may include any organic polymer and a photo-active compound having a molecular structure that can attach to the molecular structure of the organic polymer.

Regardless of the specific material forming the protective layer 30, the protective layer 30 is formed with its upper surface 32 being planar and substantially parallel to the top surface 34 of the semiconductor substrate 12. While an OPL facilitates formation of a planar upper surface 32, other materials can be used for protective layer 30.

Figure 4:
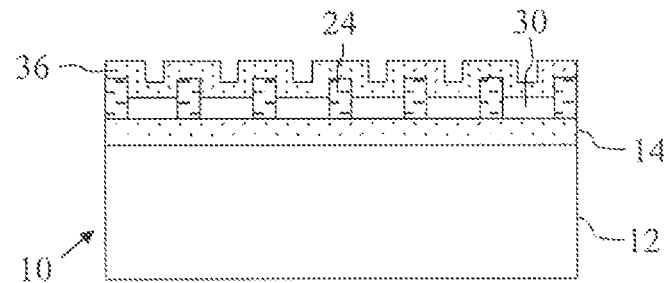

In FIG. 4, in an exemplary embodiment, a spacer-forming layer 36 is deposited over the sacrificial mandrel structures 24 and the protective layer 30. Spacer-forming layer 36 is conveniently formed via the blanket deposition of silicon nitride, silicon oxide, or another dielectric material. In an exemplary embodiment, the composition of spacer-forming layer 36 is chosen to permit sacrificial mandrel structures 24 to be removed via a subsequent etching process that is selective to the sacrificial mandrel structures 24 over the spacer-forming layer 36, e.g., sacrificial mandrel structures 24 and spacer-forming layer 36 may be silicon nitride and silicon oxide, respectively, thereby permitting sacrificial mandrel structures 24 to be selectively removed utilizing a hot phosphoric acid wet etch.

Figure 5:
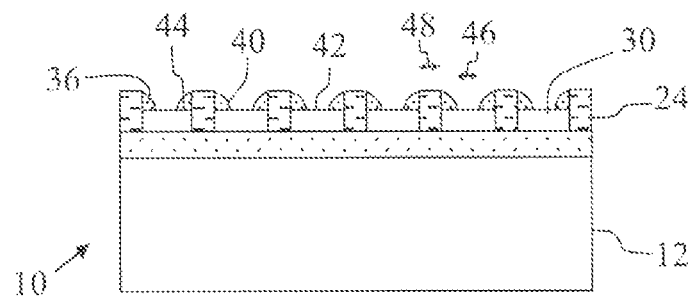

Next, as illustrated in FIGS. 5-8, the partially-completed integrated circuit 10 is subjected to a series of sequential etching steps. With reference to FIG. 5, in an embodiment, an anisotropic or directional etch is first performed to remove selected regions of spacer-forming layer 36 and to create spacers 40 adjacent opposing sides of each sacrificial mandrel structure 24. As a result of the formation of spacers 40, exposed regions 42 of the protective layer 30 are defined between adjacent sacrificial mandrel structures 24. Further, covered regions 44 of the protective layer 30 are formed lying under the spacers 40. As discussed below, the width, as indicated by double-headed arrow 46, of each exposed region 42 is substantially equal to the width, as indicated by double-headed arrow 48, of each sacrificial mandrel structure 24.

Figure 6:
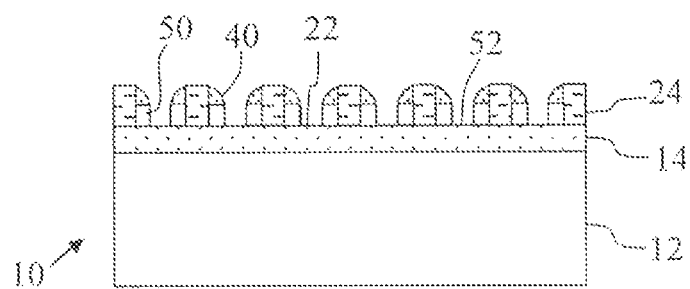

In an embodiment, with reference to FIG. 6, a second etching process is then performed to selectively remove the exposed regions 42 of the protective layer 30 and to form mask segments 50 from the covered regions 44 of the protective layer 30, i.e., the protective layer 30 lying under the spacers 40. As shown, the etching process defines a first group of exposed regions 52 of the surface 22 of the capping layer 14 (it is noted that in embodiments that lack a capping layer 14, the etching process will expose regions 52 of the surface 22 of the semiconductor substrate 12). The exposed regions 52 may be considered outer exposed regions 52, in reference to their position relative to the pairs of spacers 40 formed around sacrificial mandrel structures 24. In an exemplary process, the exposed regions 42 of the protective layer 30 are selectively removed by a dry etch process, such as by a reactive ion etch.

Figure 7:
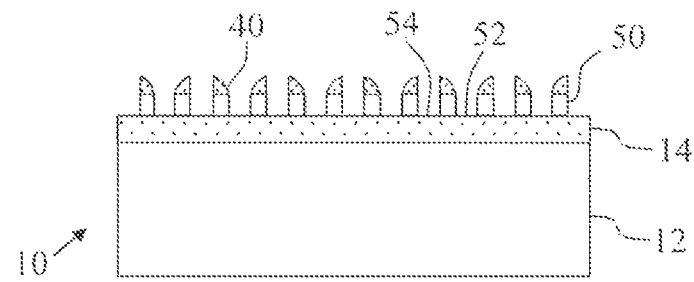

In FIG. 7, the sacrificial mandrel structures 24 are removed by another etch process in accordance with an embodiment. For example, a dry etch selective to the sacrificial mandrel structures 24, such as a reactive ion etch, may be performed. Alternatively, a hot phosphoric acid wet etch may be used. Removal of the sacrificial mandrel structures 24 defines a second group of exposed regions 54 of the surface 22 of the capping layer 14 (it is noted that in embodiments that lack a capping layer 14, the etching process will expose regions 54 of the surface 22 of the semiconductor substrate 12). Exposed regions 54 may be considered inner exposed regions 54 in reference to their position relative to the pairs of spacers 40 formed around sacrificial mandrel structures 24. As shown in FIG. 7, outer exposed regions 52 and inner exposed regions 54 alternate across the partially-completed integrated circuit 10. Cross-referencing FIG. 7 with FIG. 5, the widths 46 of the outer exposed regions 52 are substantially equal to the widths 48 of the inner exposed regions 54.

Figure 8:
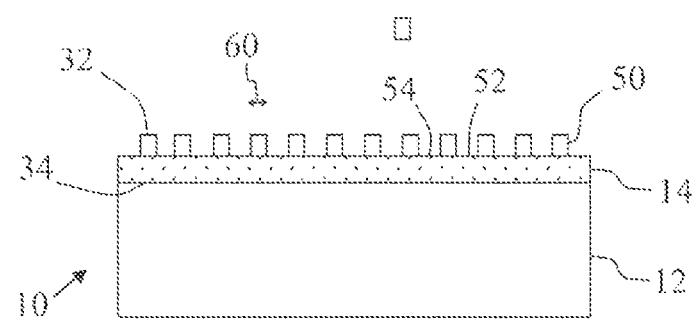

The spacers 40 are removed from the partially-completed integrated circuit 10 in FIG. 8 in accordance with another exemplary embodiment. Spacer removal may be performed by a dry etch, such as a reactive ion etch. As a result of the removal of spacers 40, mask segments 50 are exposed. Each mask segment 50 has upper surface 32 parallel to the top surface 34 of the semiconductor substrate 12. Further, the mask segments have a uniform width, indicated by double-headed arrow 60. In certain exemplary embodiments, the width 60 is equal to the width 46 of outer exposed regions 52 and the width 48 of inner exposed regions 54 shown in FIGS. 5 and 7.

Figure 9:
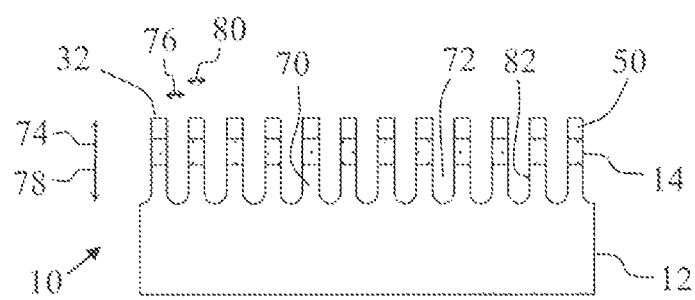

In FIG. 9, an anisotropic etch is performed to etch the semiconductor substrate 12 (and capping layer 14, if utilized) into fin structures 70. Specifically, a wet etch is performed with an appropriate etchant chemistry that etches the semiconductor substrate 12 and the capping layer 14 to form recesses 72 between fin structures 70. The mask segments 50 are not etched by the etchant chemistry and protect the underlying regions that form the fin structures 70. As used herein, the phrase "fin structures" refers in general to raised, non-planar, three dimensional structures as used in the art and are not limited to a particular shape or topography.

The planar upper surface 32 of each mask segment 50 facilitates contact of a substantially uniform amount of etchant in each region 52 and 54 (shown in FIG. 8). Specifically, the mask segments 50 are not sloped toward outer regions 52 or inner regions 54 and do not divert an increased amount of etchant to either region 52 or 54. As a result, depths, indicated by double-headed arrow 74, of the recesses 72 in FIG. 9 are substantially equal to one another, and widths, indicated by double-headed arrow 76, of the recesses 72 are substantially equal to one another. Accordingly, heights, indicated by double-headed arrow 78, of the fin structures 70 are substantially equal to one another, and widths, indicated by double-headed arrow 80, of the fin structures 70 are substantially equal to one another. As shown, the fin structures 70 are formed with substantially vertical sidewalls 82.

As a result of the process described above, the integrated circuit 10 in FIG. 8 includes fin structures 70 of uniform height and uniform width, with uniformly vertical sidewalls 82, and which are distanced from one another by uniform distances. Further, the fabrication methods described herein are easily incorporated into existing and planned fabrication processes. Additional processing of the integrated circuit 10 shown in FIG. 8 may include removal of the mask segments 50 and capping layer 14, or may leave the mask segments 50 and capping layer 14 in position over fin structures 70. Further processing may include the formation of gates, source/drain regions, contacts, interconnects, and other integrated circuit structures as is known in the art.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating integrated circuits comprising:
providing a mandrel layer overlying a semiconductor substrate;
patterning the mandrel layer into mandrel structures;
forming a protective layer between the mandrel structures;
forming spacers around each of the mandrel structures and overlying portions of the protective layer to define exposed regions of the protective layer and covered regions of the protective layer;
etching the exposed regions of the protective layer using the spacers and the mandrel structures as a mask;
removing the spacers from the covered regions of the protective layer, wherein the covered regions of the protective layer form mask segments for etching the semiconductor substrate;
removing the mandrel structures; and
etching the semiconductor substrate exposed between mask segments to form semiconductor fin structures.

2. The method of claim 1 wherein etching the semiconductor substrate exposed between mask segments to form semiconductor fin structures comprises forming recesses between semiconductor fin structures, wherein the recesses have a uniform width.

3. The method of claim 1 wherein the forming a protective layer between the mandrel structures comprises forming a protective layer between the mandrel structures having a substantially planar upper surface, and wherein the covered regions of the protective layer form mask segments having substantially planar upper surfaces.

4. The method of claim 1 wherein forming a protective layer between the mandrel structures comprises:
   coating the semiconductor substrate with a flowable material; and
   etching the flowable material to form the protective layer between the mandrel structures.

5. The method of claim 1 wherein forming a protective layer between the mandrel structures comprises coating the semiconductor substrate with an organic planarizing layer (OPL) and curing the OPL to form the protective layer between the mandrel structures having a planar upper surface.

6. The method of claim 1 wherein forming spacers around each of the mandrel structures and overlying the protective layer comprises forming each spacer separated from a first adjacent spacer by a first distance and separated from a second adjacent spacer by a second distance equal to the first distance.

7. The method of claim 6 wherein etching the semiconductor substrate exposed between mask segments to form semiconductor fin structures comprises forming semiconductor fin structures separated by the first distance.

8. The method of claim 7 wherein removing the spacers from the covered regions of the protective layer exposes the mask segments having substantially planar upper surfaces.

9. A method for fabricating semiconductor fin structures for integrated circuits comprising:
   forming mandrel structures from a mandrel layer overlying a surface of a semiconductor substrate;
   forming a layer between the mandrel structures;
   forming spacers overlying the layer to define exposed regions of the layer and covered regions of the layer;
   etching the exposed regions of the layer, wherein each covered region of the layer forms a mask segment and each mask segment has a planar upper surface substantially parallel to the surface of the semiconductor substrate;
   removing the mandrel structures; and
   etching the semiconductor substrate between mask segments to form the semiconductor fin structures.

10. The method of claim 9 wherein etching the semiconductor substrate between mask segments to form the semiconductor fin structures comprises etching the semiconductor substrate between mask segments to form the semiconductor fin structures separated by a uniform distance.

11. The method of claim 9 wherein etching the semiconductor substrate between mask segments to form the semiconductor fin structures comprises etching the semiconductor substrate between mask segments to form the semiconductor fin structures having substantially vertical sidewalls.

12. The method of claim 9 further comprising removing the spacers from the covered regions of the layer.

13. The method of claim 12 wherein removing the spacers from the covered regions of the layer exposes the mask segments having substantially planar upper surfaces.

14. The method of claim 9 wherein the forming the layer between the mandrel structures comprises forming a protective layer between the mandrel structures having a substantially planar upper surface.

15. The method of claim 9 wherein forming the layer between the mandrel structures comprises:
   coating the semiconductor substrate with a flowable material; and
   etching the flowable material to form the layer between the mandrel structures.

16. The method of claim 9 wherein forming the layer between the mandrel structures comprises coating the semiconductor substrate with an organic planarizing layer (OPL) and curing the OPL to form the layer between the mandrel structures having a planar upper surface.

17. The method of claim 9 wherein forming spacers around each of the mandrel structures and overlying the layer comprises forming each spacer separated from a first adjacent spacer by a first distance and separated from a second adjacent spacer by a second distance equal to the first distance.

18. The method of claim 17 wherein etching the semiconductor substrate between mask segments to form the semiconductor fin structures comprises etching the semiconductor substrate between mask segments to form the semiconductor fin structures separated by the first distance.

19. A method for fabricating integrated circuits comprising:
   forming mandrel structures overlying a surface of a semiconductor substrate;
   coating the semiconductor substrate with an organic planarizing layer (OPL) and curing the OPL to form a protective layer between the mandrel structures;
   forming spacers around each of the mandrel structures and overlying portions of the protective layer to define exposed regions of the protective layer and covered regions of the protective layer;
   etching the exposed regions of the protective layer using the spacers and the mandrel structures as a mask;
   removing the mandrel structures and the spacers, wherein the covered regions of the protective layer form mask segments; and
   etching the semiconductor substrate exposed between mask segments to form semiconductor fin structures.

20. The method of claim 19 wherein coating the semiconductor substrate with an organic planarizing layer (OPL) and curing the OPL to form a protective layer between the mandrel structures comprises forming a protective layer having a planar upper surface, and wherein removing the mandrel structures and the spacers forms mask segments having a planar upper surface.

* * * * *